US009653536B2

United States Patent
Chibko et al.

(10) Patent No.: US 9,653,536 B2
(45) Date of Patent: May 16, 2017

(54) METHOD FOR FABRICATING A STRUCTURE

(71) Applicant: Soitec, Crolles (FR)

(72) Inventors: Alexandre Chibko, Saint Nazaire les Eymes (FR); Isabelle Bertrand, Bernin (FR); Sylvain Peru, Le Versoud (FR); Sothachett Van, Le Versoud (FR); Patrick Reynaud, Murianette (FR)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 14/646,642

(22) PCT Filed: Dec. 2, 2013

(86) PCT No.: PCT/IB2013/002692
§ 371 (c)(1),
(2) Date: May 21, 2015

(87) PCT Pub. No.: WO2014/091285
PCT Pub. Date: Jun. 19, 2014

(65) Prior Publication Data
US 2015/0303247 A1    Oct. 22, 2015

(30) Foreign Application Priority Data

Dec. 14, 2012  (FR) .................................... 12 03428

(51) Int. Cl.
*H01L 21/324*    (2006.01)
*H01L 29/04*    (2006.01)
(Continued)

(52) U.S. Cl.
CPC .......... *H01L 29/04* (2013.01); *H01L 21/0262* (2013.01); *H01L 21/02263* (2013.01);
(Continued)

(58) Field of Classification Search
CPC .............. H01L 29/04; H01L 21/02263; H01L 21/02524; H01L 21/0262; H01L 21/02664; H01L 21/324
(Continued)

(56) References Cited

U.S. PATENT DOCUMENTS 7,405,136 B2    7/2008  Delprat et al.
7,413,964 B2    8/2008  Reynaud et al.
(Continued)

FOREIGN PATENT DOCUMENTS

EP       1688990 A2     8/2006
FR       2953640 A1     6/2011
WO    2011067394 A1     6/2011

OTHER PUBLICATIONS

French, P.J, Polysilicon: A Versatile Material for Microsystems, Sensors and Acutators, vol. A, (2002), pp. 3-12.
(Continued)

*Primary Examiner* — Mark Tornow
(74) *Attorney, Agent, or Firm* — TraskBritt

(57) ABSTRACT

A method for fabricating a structure comprising, in succession, a support substrate, a dielectric layer, an active layer, a separator layer of polycrystalline silicon, comprising the steps of: a) providing a donor substrate, b) forming an embrittlement area in the donor substrate, c) providing the support structure, d) forming the separator layer on the support substrate, e) forming the dielectric layer, f) assembling the donor substrate and the support substrate, g) fracturing the donor substrate along the embrittlement area, h) subjecting the structure to a strengthening annealing of at least 10 minutes, the fabrication method being noteworthy in that step d) is executed in such a way that the polycrystalline silicon of the separator layer exhibits an entirely random grain orientation, and in that the strengthening annealing is
(Continued)

executed at a temperature strictly greater than 950° C. and less than 1200° C.

20 Claims, 2 Drawing Sheets

(51) Int. Cl.
*H01L 21/762* (2006.01)
*H01L 21/02* (2006.01)
*H01L 29/16* (2006.01)
*H01L 21/265* (2006.01)

(52) U.S. Cl.
CPC .. *H01L 21/02524* (2013.01); *H01L 21/02664* (2013.01); *H01L 21/324* (2013.01); *H01L 21/76254* (2013.01); *H01L 29/16* (2013.01); *H01L 21/26506* (2013.01)

(58) Field of Classification Search
USPC .......................................................... 257/49
See application file for complete search history.

(56) References Cited

U.S. PATENT DOCUMENTS

| | | | |
|---|---|---|---|
| 7,718,534 B2 | 5/2010 | Martinez et al. | |
| 7,736,994 B2 | 6/2010 | Reynaud et al. | |
| 7,892,861 B2 | 2/2011 | Ecarnot et al. | |
| 8,357,587 B2 | 1/2013 | Schwarzenbach et al. | |
| 8,389,412 B2 | 3/2013 | Schwarzenbach et al. | |
| 8,617,962 B2 | 12/2013 | Schwarzenbach et al. | |
| 8,658,514 B2 | 2/2014 | Reynaud et al. | |
| 8,962,450 B2 | 2/2015 | Reynaud et al. | |
| 8,962,492 B2 | 2/2015 | Reynaud et al. | |
| 2004/0213907 A1* | 10/2004 | Todd | C23C 16/22 427/255.18 |
| 2007/0032040 A1* | 2/2007 | Lederer | H01L 21/76254 438/455 |
| 2007/0087526 A1 | 4/2007 | Chhaimi et al. | |
| 2007/0087570 A1 | 4/2007 | Martinez et al. | |
| 2007/0169684 A1* | 7/2007 | Stoddard | C30B 11/00 117/13 |
| 2008/0213981 A1 | 9/2008 | Renaud et al. | |
| 2010/0167500 A1 | 7/2010 | Chhaimi et al. | |
| 2010/0181653 A1* | 7/2010 | Aulnette | H01L 21/02032 257/629 |
| 2011/0092051 A1* | 4/2011 | Moriceau | H01L 21/26506 438/458 |
| 2012/0217622 A1* | 8/2012 | Bedell | H01L 21/78 257/632 |
| 2012/0223419 A1 | 9/2012 | Kerdiles et al. | |
| 2012/0319121 A1* | 12/2012 | Reynaud | H01L 21/76254 257/66 |
| 2013/0045583 A1 | 2/2013 | Reynaud et al. | |
| 2015/0014822 A1 | 1/2015 | Reynaud et al. | |

OTHER PUBLICATIONS

International Search Report for International Application No. PCT/IB2013/002692 dated Jan. 27, 2014, 4 pages.
International Written Opinion of the International Search Authority for International Application No. PCT/IB2013/002692 dated Jan. 27, 2014, 5 pages.
International Preliminary Report on Patentability for International Application No. PCT/IB2013/002692 dated Jun. 16, 2015, 6 pages.

* cited by examiner

METHOD FOR FABRICATING A STRUCTURE

CROSS-REFERENCE TO RELATED APPLICATIONS

This application is a national phase entry under 35 U.S.C. §371 of International Patent Application PCT/IB2013/002692, filed Dec. 2, 2013, designating the United States of America and published in English as International Patent Publication WO 2014/091285 A1 on Jun. 19, 2014, which claims the benefit under Article 8 of the Patent Cooperation Treaty and under 35 U.S.C. §119(e) to French Patent Application Serial No. 12/03428, filed Dec. 14, 2012, the disclosure of each of which is hereby incorporated herein in its entirety by this reference.

TECHNICAL FIELD

This disclosure relates to a method for fabricating a structure comprising, in succession, a support substrate, a dielectric layer, an active layer produced in a semiconductor material, and a so-called separator layer of polycrystalline silicon inserted between the support substrate and the dielectric layer. This disclosure also relates to a structure comprising, in succession, a support substrate having a resistivity greater than a predetermined value, a dielectric layer, an active layer produced in a semiconductor material, and a so-called separator layer of polycrystalline silicon inserted between the support substrate and the dielectric layer.

BACKGROUND

Such a structure is particularly suited to high-frequency (HF) applications; that is to say, applications above 100 MHz, for example, a radio-frequency (RF) application for integrated circuits with an operating frequency with an order of magnitude of a few GHz, the support substrate being highly resistive (that is to say, that the predetermined resistivity value is greater than 500 Ω·cm).

One fabrication method known from the prior art, notably from French Patent FR 2 953 640 (hereinbelow D1), comprises the steps of: a) providing a donor substrate produced in the semiconductor material, b) forming an embrittlement area in the donor substrate so as to delimit a first portion and a second portion of the donor substrate on either side of the embrittlement area, the first portion being intended to form the active layer, c) providing the support substrate having a resistivity greater than a predetermined value, d) forming the separator layer on the support substrate, e) forming the dielectric layer on the first portion of the donor substrate and/or on the separator layer, f) assembling the donor substrate and the support substrate through the intermediary of the dielectric layer and the separator layer, g) fracturing the donor substrate along the embrittlement area so as to obtain the structure, and h) subjecting the structure to a strengthening annealing of at least 10 minutes after step g).

As specified in D1, the strengthening annealing is executed during step h) at a temperature less than 950° C. so that the heat budget applied is not sufficient to transform the polycrystalline silicon of the separator layer into monocrystalline silicon. It is essential for the separator layer not to be transformed into monocrystalline silicon in order to retain a resistivity of the structure that is satisfactory for RF application.

D1 stresses that the fact that limiting the duration and/or the temperature of the strengthening annealing generates an embrittlement in the interface created during assembly step f). D1 remedies this drawback by intermediate treatments, such as a plasma treatment, capable of strengthening the cohesion of the structure.

BRIEF SUMMARY

This disclosure aims to provide an alternative in order to dispense with these intermediate treatments.

To this end, this disclosure relates to a method for fabricating a structure comprising, in succession, a support substrate, a dielectric layer, an active layer produced in a semiconductor material, and a so-called separator layer of polycrystalline silicon inserted between the support substrate and the dielectric layer, the fabrication method comprising the steps of: a) providing a donor substrate produced in the semiconductor material, b) forming an embrittlement area in the donor substrate so as to delimit a first portion and a second portion of the donor substrate on either side of the embrittlement area, the first portion being intended to form the active layer, c) providing the support substrate having a resistivity greater than a predetermined value, d) forming the separator layer on the support substrate, e) forming the dielectric layer on the first portion of the donor substrate and/or on the separator layer, f) assembling the donor substrate and the support substrate through the intermediary of the dielectric layer and the separator layer, g) fracturing the donor substrate along the embrittlement area so as to obtain the structure, h) subjecting the structure to a strengthening annealing of at least 10 minutes after step g), the fabrication method being noteworthy in that step d) is executed in such a way that the polycrystalline silicon of the separator layer exhibits an entirely random grain orientation over at least a portion of the thickness of the separator layer facing the support substrate, and in that the strengthening annealing is executed during step h) at a temperature strictly greater than 950° C. and less than 1200° C.

There are three types of morphology for polycrystalline silicon:
- a random-type morphology, that is to say, with a random crystallographic grain orientation, whatever the direction;
- a column-type morphology, that is to say, with a crystallographic grain orientation favored in a generally substantially vertical direction, denoted; and
- a mixed morphology between a random morphology and a column morphology.

Thus, step d) is executed in conditions that are suited to the polycrystalline silicon of the separator layer exhibiting an entirely random grain orientation, that is to say, equiaxial grains, over at least a portion of the thickness of the separator layer facing the support substrate.

According to one form of execution, step d) is executed in conditions suited to the polycrystalline silicon of the separator layer exhibiting an entirely random grain orientation over at least 10% of the thickness of the separator layer, preferably over at least 25% of the thickness of the separator layer.

The applicant has found, surprisingly, that such a morphology for the polycrystalline silicon over a portion of the separator layer facing the support substrate makes it possible to subject the structure to a strengthening annealing during step h) with an increased heat budget compared to the prior art without transforming the polycrystalline silicon of the separator layer into monocrystalline silicon. It is therefore possible, with such a morphology for the polycrystalline silicon of the separator layer, to execute the strengthening annealing at a temperature strictly greater than 950° C., and thereby to dispense with the intermediate treatments such as a plasma treatment from the prior art.

According to one mode of execution, the polycrystalline silicon of the separator layer exhibits an entirely random grain orientation over substantially all the thickness of the separator layer.

Thus, it is possible to subject the structure to a strengthening annealing during step h) with a maximum heat budget compared to the prior art without transforming the polycrystalline silicon of the separator layer into monocrystalline silicon.

According to one form of execution, step d) comprises a step d1) of vapor phase chemical deposition of the separator layer, at atmospheric pressure, and with a deposition temperature of between 800° C. and 1050° C., preferably 850° C.

Thus, such conditions for step d) make it possible to form a separator layer with a polycrystalline silicon exhibiting an entirely random grain orientation.

Advantageously, step d1) is executed with a growth rate in a saturated regime under reactive gas depletion, the reactive gases being preferentially trichlorosilane and hydrogen with a preferential ratio of 1:6.

Thus, such conditions are particularly favorable for forming a separator layer with a polycrystalline silicon exhibiting an entirely random grain orientation.

According to one form of execution, the strengthening annealing is executed during step h) at a temperature greater than 1000° C. for at least 1 hour, preferably at a temperature greater than 1100° C. for at least 2 hours.

Thus, such heat budgets can be applied to the structure without transforming the polycrystalline silicon of the separator layer into monocrystalline silicon, and make it possible to strengthen the interface created during the assembly step f).

In one mode of execution, the separator layer has a thickness, denoted e, greater than or equal to a so-called critical thickness, denoted $e_c$, below which the structure exhibits a radio-frequency power in terms of second-harmonic generation less than a predetermined value, and above which the structure exhibits a radio-frequency power in terms of second-harmonic generation greater than or equal to the predetermined value, the predetermined value being preferably between 85 and 105 dBm as an absolute value, even more preferentially equal to 90 dBm as an absolute value.

Thus, the applicant has found that the radio-frequency performance levels in terms of second-harmonic generation are mainly governed by a minimal thickness of the separator layer.

According to one form of execution, the thickness of the separator layer satisfies the following relationship: $e_c \leq e \leq 10\, e_c$, preferentially $e_c \leq e \leq 5\, e_c$, even more preferentially $e_c \leq e \leq 2\, e_c$.

Advantageously, the predetermined value of the resistivity of the support substrate is greater than or equal to 3000 Ω·cm.

Thus, the applicant has found that, from this resistivity value of the support substrate, the radio-frequency performance levels in terms of attenuation and cross-talk are independent of the separator layer, whereas the performance levels in terms of second-harmonic generation remain mainly governed by the thickness of the separator layer, with fixed resistivity for the support substrate.

According to one feature, the method comprises a step of thermal oxidation of the polycrystalline silicon of the separator layer before step f).

Thus, such a layer of oxide formed can facilitate the assembly step f), notably when this assembly is executed by molecular adhesion.

According to one mode of execution, the support substrate comprises a decoupling layer suited to decoupling the crystalline network between the support substrate and the separator layer, the separator layer being formed during step d) on the decoupling layer.

Thus, this decoupling layer avoids the transformation of the polycrystalline silicon of the separator layer into monocrystalline silicon.

Preferentially, the decoupling layer is a native oxide derived from the support substrate.

Thus, the applicant has found that such a decoupling layer quite particularly favors the formation of a separator layer of polycrystalline silicon, which exhibits an entirely random grain orientation.

This disclosure also relates to a structure comprising, in succession, a support substrate having a resistivity greater than a predetermined value, a dielectric layer, an active layer produced in a semiconductor material, and a so-called separator layer of polycrystalline silicon inserted between the support substrate and the dielectric layer, the structure being noteworthy in that the polycrystalline silicon of the separator layer exhibits an entirely random grain orientation over at least a portion of the thickness of the separator layer facing the support substrate, and in that the polycrystalline silicon of the separator layer exhibits an average grain size of between 180 nm and 250 nm, preferably between 180 nm and 200 nm. "Average size" should be understood to mean a size averaged over all the thickness of the separator layer.

Thus, such a structure according to the disclosure exhibits an excellent mechanical strength through the association of a random-type morphology for the polycrystalline silicon of the separator layer with a minimum grain size.

Such a structure according to the disclosure can be derived from a structure-strengthening heat treatment, the strengthening heat treatment being able to be executed at a temperature strictly greater than 950° C. and less than 1200° C. for at least 10 minutes, the strengthening annealing being able to be executed at a temperature greater than 1000° C. for at least 1 hour, or even at a temperature greater than 1100° C. for at least 2 hours.

Advantageously, the polycrystalline silicon of the separator layer exhibits an entirely random grain orientation over substantially all the thickness of the separator layer.

In one embodiment, the separator layer has a thickness, denoted e, greater than or equal to a so-called critical thickness, denoted $e_c$, below which the structure exhibits a radio-frequency power in terms of second-harmonic generation less than a predetermined value, and above which the structure exhibits a radio-frequency power in terms of second-harmonic generation greater than or equal to the predetermined value, the predetermined value being preferably between 85 and 105 dBm as an absolute value, even more preferentially equal to 90 dBm as an absolute value.

Thus, the applicant has found that the radio-frequency performance levels in terms of second-harmonic generation are mainly governed by a minimal thickness of the separator layer.

According to one form of execution, the thickness of the separator layer satisfies the following relationship: $e_c \leq e \leq 10\, e_c$, preferentially $e_c \leq e \leq 5\, e_c$, even more preferentially $e_c \leq e \leq 2\, e_c$.

Advantageously, the predetermined value of the resistivity of the support substrate is greater than or equal to 3000 Ω·cm.

Thus, the applicant has found that, from this resistivity value of the support substrate, the radio-frequency performance levels in terms of attenuation and cross-talk are independent of the separator layer, whereas the performance levels in terms of second-harmonic generation remain mainly governed by the thickness of the separator layer, with fixed resistivity for the support substrate.

BRIEF DESCRIPTION OF THE DRAWINGS

Other features and advantages will become apparent from the following description of one embodiment of a method according to the disclosure, given as a nonlimiting example, with reference to the accompanying drawings, in which.

DETAILED DESCRIPTION

Figure 1:
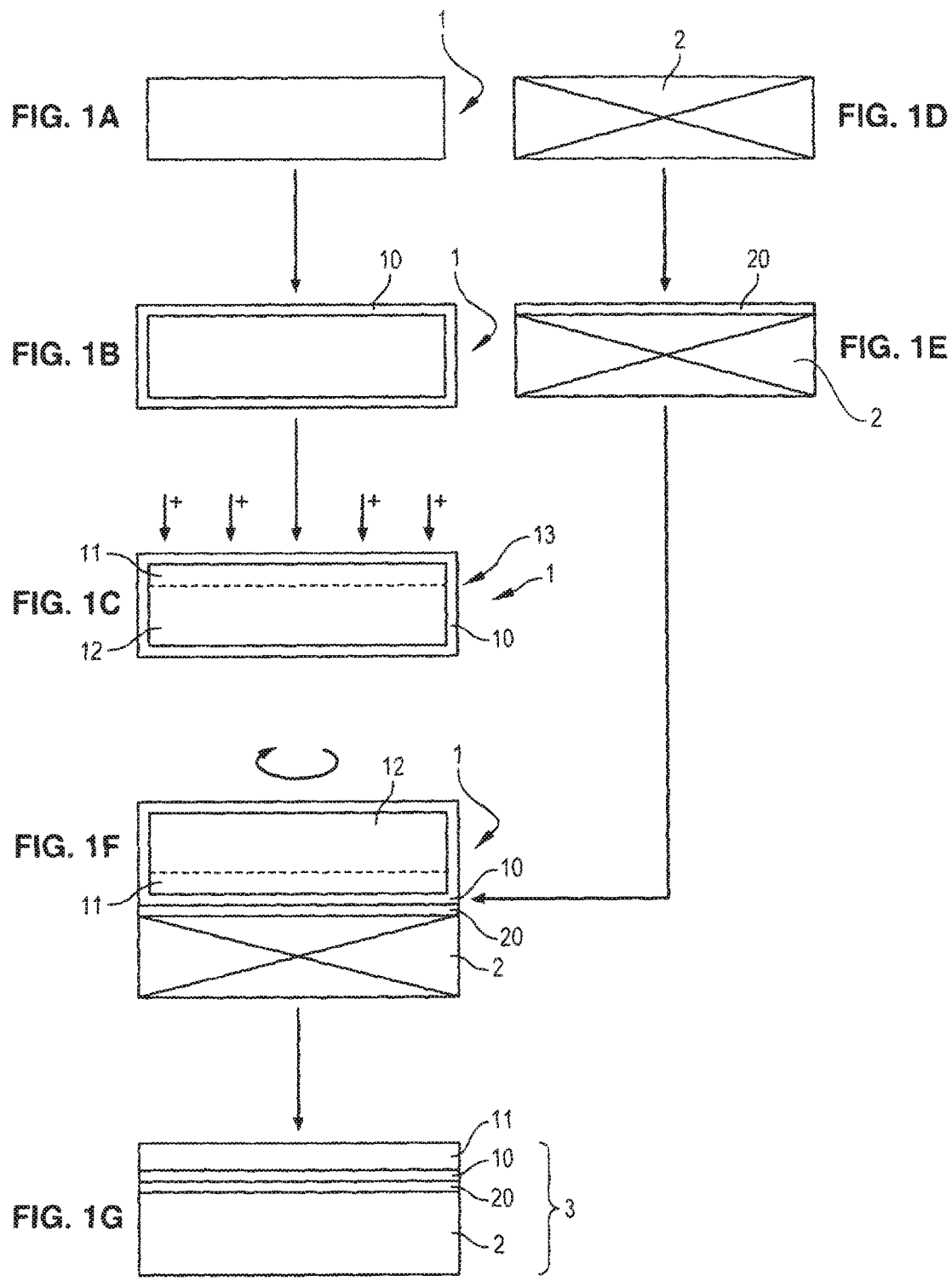
FIGS. 1A to 1G illustrate the various steps of a method for fabricating a structure according to the disclosure.

The fabrication method illustrated in FIGS. 1A to 1G is a method for fabricating a structure 3 (FIG. 1G) comprising, in succession, a support substrate 2, a dielectric layer 10, an active layer 11 produced in a semiconductor material, and a so-called separator layer 20 of polycrystalline silicon inserted between the support substrate 2 and the dielectric layer 10.

The fabrication method comprises a step a), illustrated in FIG. 1A, of providing a donor substrate 1 of the semiconductor material. The semiconductor material of the donor substrate 1 can be silicon.

The fabrication method comprises a step e), illustrated in FIG. 1B, of forming the dielectric layer 10 on the donor substrate 1. The dielectric layer 10 can be silicon dioxide. This dielectric layer 10 may result from a thermal oxidation of the donor substrate 1 or may have been formed by deposition, conventionally, by one of the vapor phase chemical deposition techniques well known to those skilled in the art by the abbreviations CVD and LPCVD (standing for "Chemical Vapor Deposition" and "Low-Pressure Chemical Vapor Deposition").

The fabrication method comprises a step b), illustrated in FIG. 1C, of forming an embrittlement area 13 in the donor substrate 1 so as to delimit a first portion 11 and a second portion 12 of the donor substrate 1 on either side of the embrittlement area 13, the first portion 11 being intended to form the active layer. The embrittlement area 13 is formed during step b), preferably by the implantation of species, such as hydrogen and/or helium. The implantation can be performed with a single species such as hydrogen, but also with a plurality of species implanted sequentially such as hydrogen and helium. The parameters of the implantation, essentially the dose and the energy, are determined according to the nature of the species and of the donor substrate 1.

The fabrication method comprises a step c), illustrated in FIG. 1D, of providing the support substrate 2 having a resistivity greater than a predetermined value. The minimum predetermined value of the resistivity is conventionally 500 Ω·cm. The support substrate 2 can be produced in silicon. This support substrate 2 has the feature of having undergone a heat treatment capable of conferring upon it a resistivity greater than 500 Ω·cm, or even greater than 1000 Ω·cm, even more preferably greater than 2000 Ω·cm, or even more preferentially greater than 3000 Ω·cm. This heat treatment may have been implemented at the time of the fabrication of the support substrate 2, or later during the fabrication method as described herein. According to one alternative, the support substrate 2 may comprise a material with a low oxygen content in order to confer upon it a resistivity greater than 500 Ω·cm.

The fabrication method comprises a step d), illustrated in FIG. 1E, of forming the separator layer 20 on the support substrate 2. Step d) comprises a step d1) of vapor phase chemical deposition of the separator layer 20, at atmospheric pressure (that is to say, a deposition of PECVD type), and with a deposition temperature of between 800° C. and 1050° C., preferably 850° C. Step d1) is executed with a growth rate in a saturated regime under reactive gas depletion. Thus, step d) is executed in such a way that the polycrystalline silicon of the separator layer 20 exhibits an entirely random grain orientation over all or part of the thickness of the separator layer 20, or, in other words, the polycrystalline silicon of the separator layer 20 has equiaxial grains over all or part of the thickness of the separator layer 20.

The fabrication method comprises a step f), illustrated in FIG. 1F, of assembling the donor substrate 1 and the support substrate 2 through the intermediary of the dielectric layer 10 and the separator layer 20. Step f) can be executed by bonding of molecular adhesion type.

Before the assembly step f) and after an optional step of polishing the free surface of the separator layer 20 (not illustrated), the separator layer 20 has a thickness, denoted e, greater than or equal to a so-called critical thickness, denoted $e_c$, below which the structure 3 exhibits a radio-frequency power in terms of second-harmonic generation less than a predetermined value, and above which the structure 3 exhibits a radio-frequency power in terms of second-harmonic generation greater than or equal to the predetermined value, the predetermined value being preferably between 85 and 105 dBm as an absolute value, even more preferentially equal to 90 dBm as an absolute value. The thickness of the separator layer 20 satisfies the following relationship: $e_c \leq e \leq 10\ e_c$, preferentially $e_c \leq e \leq 5\ e_c$, even more preferentially $e_c \leq e \leq 2\ e_c$. As an example, the critical thickness of the separator layer 20 is of the order of 1 μm. When the fabrication method comprises a step of thermal oxidation of the polycrystalline silicon of the separator layer 20 before step f), the critical thickness of the separator layer 20 is on the order of 3.5 μm. In the absence of thermal oxidation of the polycrystalline silicon of the separator layer 20, the applicant has revealed a level for the radio-frequency power in terms of second-harmonic generation. In other words, beyond the critical thickness, the radio-frequency power in terms of second-harmonic generation is substantially equal to the predetermined value. It should be noted that this level has not been observed in the presence of thermal oxidation of the polycrystalline silicon of the separator layer 20.

The fabrication method comprises a step g) of fracturing the donor substrate 1 along the embrittlement area 13 so as to obtain the structure 3 illustrated in FIG. 1G.

The fabrication method comprises a step h) of subjecting the structure 3 to a strengthening annealing of at least 10 minutes after step g), the strengthening annealing being executed during step h) at a temperature strictly greater than 950° C. and less than 1200° C. The strengthening annealing can be executed during step h) at a temperature greater than 1000° C. for at least 1 hour, or even at a temperature greater than 1100° C. for at least 2 hours.

In the structure 3 illustrated in FIG. 1G, the polycrystalline silicon of the separator layer 20 exhibits, after step h), an average grain size of between 180 nm and 250 nm, preferentially between 180 nm and 200 nm, depending on the heat budget employed.

Figure 2:
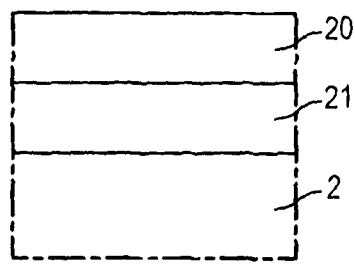
FIG. 2 is a partial view of the structure with the presence of a decoupling layer.

As illustrated in FIG. 2, the support substrate 2 may comprise a decoupling layer 21 suited to decoupling the crystalline network between the support substrate 2 and the separator layer 20, the separator layer 20 being formed during step d) on the decoupling layer 21. When the support substrate 2 is produced in silicon, the decoupling layer 21 can be a layer with a concentration gradient that exhibits a lattice parameter different from that of the silicon. This lattice parameter difference is, for example, greater than 5%. This decoupling layer 21 should not under any circumstances contain pure monocrystalline silicon. The decoupling layer 21 may also be produced in an IV-IV material such as SiC or SiGe.

Moreover, the separator layer 20 makes it possible, by virtue of its cavities and grain joints, to:
trap the contaminants that generate a drop in resistivity (B, P, Ca, Na, etc.); and
form a barrier to the electrical charges contained under the dielectric layer 10.

Figure 3:
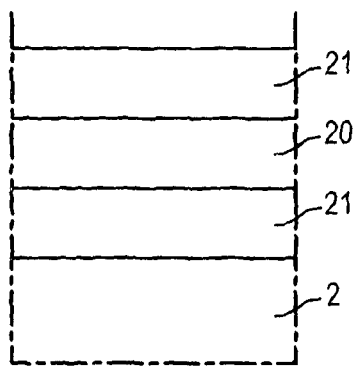
FIG. 3 is a variant of execution of FIG. 2 with an additional decoupling layer.

As shown in FIG. 3, it is also possible to form an additional decoupling layer 21, such that the separator layer 20 is sandwiched between two decoupling layers 21. The additional decoupling layer 21 makes it possible to avoid having the polycrystalline silicon of the separator layer 20 transformed into monocrystalline silicon from the active layer 11 (FIG 1G), when the active layer 11 is produced in monocrystalline silicon.

Figure 4:
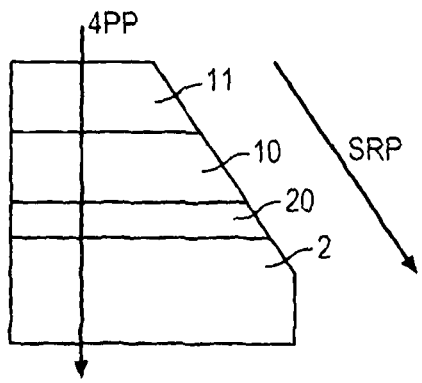
FIG. 4 is a cross-sectional view of a structure according to the disclosure illustrating the implementation of a resistivity test.

In FIG. 4, the aim is to test the resistivity of a structure obtained in accordance with the invention.

This characterization is accomplished on the one hand using the well-known so-called "4PP" (standing for "four points probe") method, namely, by the use of four electrodes passing through all of the structure.

A second method, called "SRP," also well known, makes it possible to plot the trend of the resistivity as a function of the depth, through a bevel, as shown by FIG. 4.

Obviously, the mode of execution of the disclosure described above is in no way limiting. Details and enhancements can be added thereto in other variants of execution without in any way departing from the framework of the disclosure.

The invention claimed is:

1. A method for fabricating a structure comprising, in succession, a support substrate, a dielectric layer, an active layer comprising a semiconductor material, and a separator layer of polycrystalline silicon inserted between the support substrate and the dielectric layer, the fabrication method comprising the steps of:
  a) providing a donor substrate comprising the semiconductor material,
  b) forming an embrittlement area in the donor substrate so as to delimit a first portion and a second portion of the donor substrate on either side of the embrittlement area, the first portion being intended to form the active layer,
  c) providing the support substrate having a resistivity greater than a predetermined value,
  d) forming the polycrystalline silicon of the separator layer on the support substrate, at least a portion of the separator layer extending continuously adjacent and across the support substrate and through at least a portion of the thickness of the separator layer comprising polycrystalline silicon exhibiting an entirely random grain orientation,
  e) forming the dielectric layer on the first portion of the donor substrate and/or on the separator layer,
  f) assembling the donor substrate and the support substrate through the intermediary of the dielectric layer and the separator layer,
  g) fracturing the donor substrate along the embrittlement area so as to obtain the structure, and
  h) subjecting the structure to a strengthening anneal for at least 10 minutes and at a temperature strictly greater than 950° C. and less than 1200° C. after step g).

2. The method according to claim 1, wherein the at least a portion of the separator layer extends through at least substantially the entire thickness of the separator layer.

3. The method according to claim 2, wherein step d) comprises a step d1) of vapor phase chemical deposition of the separator layer at atmospheric pressure and with a deposition temperature of between 800° C. and 1050° C.

4. The method according to claim 3, wherein step d1) is executed with a growth rate in a saturated regime under reactive gas depletion, the reactive gases comprising trichlorosilane and hydrogen.

5. The method according to claim 1, wherein the strengthening anneal is executed for at least 1 hour and at a temperature greater than 1000° C. and less than 1200° C. during step h).

6. The method according to claim 1, wherein the separator layer has a thickness, denoted e, greater than or equal to a critical thickness, denoted $e_c$, below which the structure exhibits a radio-frequency power in terms of second-harmonic generation less than a predetermined value, and above which the structure exhibits a radio-frequency power in terms of second-harmonic generation greater than or equal to the predetermined value.

7. The method according to claim 6, wherein the thickness of the separator layer satisfies the following relationship: $e_c \leq e \leq 10\ e_c$.

8. The method according to claim 6, wherein the predetermined value is between 85 and 105 dBm as an absolute value.

9. The method according to claim 7, wherein the thickness of the separator layer satisfies the following relationship: $e_c \leq e \leq 5\ e_c$.

10. The method according to claim 1, wherein the predetermined value of the resistivity of the support substrate is greater than or equal to 3000 Ω·cm.

11. The method according to claim 1, wherein the method comprises a step of thermal oxidation of the polycrystalline silicon of the separator layer before step f).

12. The method according to claim 1, wherein the support substrate comprises a decoupling layer suited to decoupling a crystalline network between the support substrate and the separator layer, the separator layer being formed during step d) on the decoupling layer.

13. The method according to claim 12, wherein the decoupling layer is a native oxide derived from the support substrate.

14. A structure comprising, in succession, a support substrate having a resistivity greater than a predetermined value, a dielectric layer, an active layer produced in a semiconductor material, and a separator layer of polycrystalline silicon inserted between the support substrate and the dielectric layer, wherein at least a portion of the separator layer extending continuously adjacent and across the support substrate and through at least a portion of the thickness of the separator layer comprises polycrystalline silicon exhibiting an entirely random grain orientation, and wherein the polycrystalline silicon of the separator layer exhibits an average grain size of between 180 nm and 250 nm.

15. The structure according to claim 14, wherein the at least a portion of the separator layer extends through at least substantially the entire thickness of the separator layer.

16. The structure according to claim 14, wherein the separator layer has a thickness, denoted e, greater than or equal to a critical thickness, denoted $e_c$, below which the structure exhibits a radio-frequency power in terms of second-harmonic generation less than a predetermined value, and above which the structure exhibits a radio-frequency power in terms of second-harmonic generation greater than or equal to the predetermined value.

17. The structure according to claim 16, wherein the thickness of the separator layer satisfies the following relationship: $e_c \leq e \leq 10\ e_c$.

18. The structure according to claim 16, wherein the predetermined value is between 85 and 105 dBm as an absolute value.

19. The structure according to claim 14, wherein the predetermined value of the resistivity of the support substrate is greater than or equal to 3000 Ω·cm.

20. The method according to claim 1, wherein step d) comprises a step d1) of vapor phase chemical deposition of the separator layer at atmospheric pressure and with a deposition temperature of between 800° C. and 1050° C.

* * * * *